United States Patent
Goto

(10) Patent No.: US 7,432,724 B2
(45) Date of Patent: Oct. 7, 2008

(54) CAPACITIVE PHYSICAL QUANTITY SENSOR AND METHOD OF DIAGNOSING THE SAME

(75) Inventor: Keisuke Goto, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/598,642

(22) Filed: Nov. 14, 2006

(65) Prior Publication Data

US 2007/0126432 A1    Jun. 7, 2007

(30) Foreign Application Priority Data

Nov. 30, 2005    (JP)    ............................ 2005-345308
Sep. 21, 2006    (JP)    ............................ 2006-255723

(51) Int. Cl.
G01R 27/26    (2006.01)
G01P 15/125    (2006.01)

(52) U.S. Cl. ...................... 324/661; 324/658; 73/514.32

(58) Field of Classification Search ................. 324/658, 324/649, 600, 160, 162, 661, 672, 679, 686; 73/1.38, 514.16, 514.32, 862.626; 361/280, 361/283.1, 283.3

See application file for complete search history.

(56) References Cited

U.S. PATENT DOCUMENTS

| | | | |
|---|---|---|---|
| 5,465,604 A | 11/1995 | Sherman | |
| 5,583,290 A | 12/1996 | Lewis | |
| 5,612,494 A | 3/1997 | Shibano | |
| 5,751,154 A | 5/1998 | Tsugai | |
| 5,977,803 A | 11/1999 | Tsugai | |
| 6,257,061 B1 | 7/2001 | Nonoyama et al. | |
| 6,450,029 B1 | 9/2002 | Sakai et al. | |
| 6,483,322 B2 | 11/2002 | Aoyama et al. | |
| 6,601,431 B2 | 8/2003 | Nagahara et al. | |
| 6,668,614 B2 | 12/2003 | Itakura | |
| 6,841,840 B2 * | 1/2005 | Sakai | .......................... 257/420 |
| 6,848,310 B2 * | 2/2005 | Goto | ........................ 73/514.32 |
| 6,935,176 B2 * | 8/2005 | Goto et al. | ............... 73/514.32 |
| 7,109,727 B2 * | 9/2006 | Hayakawa et al. | ........... 324/679 |
| 7,168,320 B2 * | 1/2007 | Murata et al. | ............. 73/514.32 |

(Continued)

FOREIGN PATENT DOCUMENTS

JP    A-5-52174    3/1993

(Continued)

OTHER PUBLICATIONS

Office Action dated Oct. 30, 2007 in corresponding Korean Patent Application No. 10-2006-0117259 (and English translation).

(Continued)

*Primary Examiner*—Vincent Q. Nguyen
*Assistant Examiner*—Hoai-An D Nguyen
(74) *Attorney, Agent, or Firm*—Posz Law Group, PLC

(57) ABSTRACT

A capacitive sensor for detecting a physical quantity includes a movable electrode and a fixed electrode, and a controlling unit for applying a signal between the movable electrode and the fixed electrode. The controlling unit includes an input terminal, an output terminal, and a time measuring means for measuring a time period. The controlling unit measures the time period, for which a diagnosis instruction signal is input into the input terminal. The controlling unit performs the self-diagnosis, after the instruction signal continues for a predetermined time period.

12 Claims, 9 Drawing Sheets

U.S. PATENT DOCUMENTS

| | | | |
|---|---|---|---|
| 7,287,429 B2* | 10/2007 | Umemura et al. | 73/514.32 |
| 2003/0070484 A1 | 4/2003 | Itakura | |
| 2005/0121338 A1* | 6/2005 | Inoue | 205/775 |
| 2005/0210980 A1* | 9/2005 | Umemura et al. | 73/514.32 |

FOREIGN PATENT DOCUMENTS

| | | |
|---|---|---|
| JP | A-6-213059 | 8/1994 |
| JP | A-7-178363 | 7/1995 |
| JP | A-11-46011 | 2/1999 |
| JP | A-2002-341838 | 11/2002 |

OTHER PUBLICATIONS

Office Action dated Jun. 5, 2008 in corresponding German patent application No. 10 2006 055 844.8-52 (and English translation).

Office Action dated Jun. 27, 2008 in corresponding Korean patent application No. 10-2006-0117259 (and English translation).

* cited by examiner

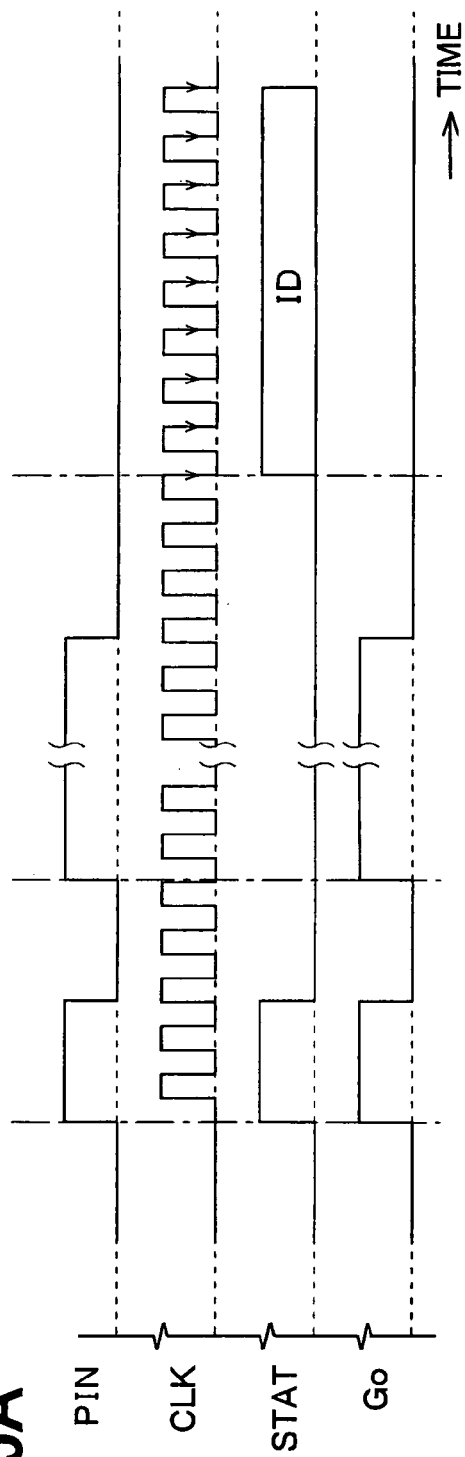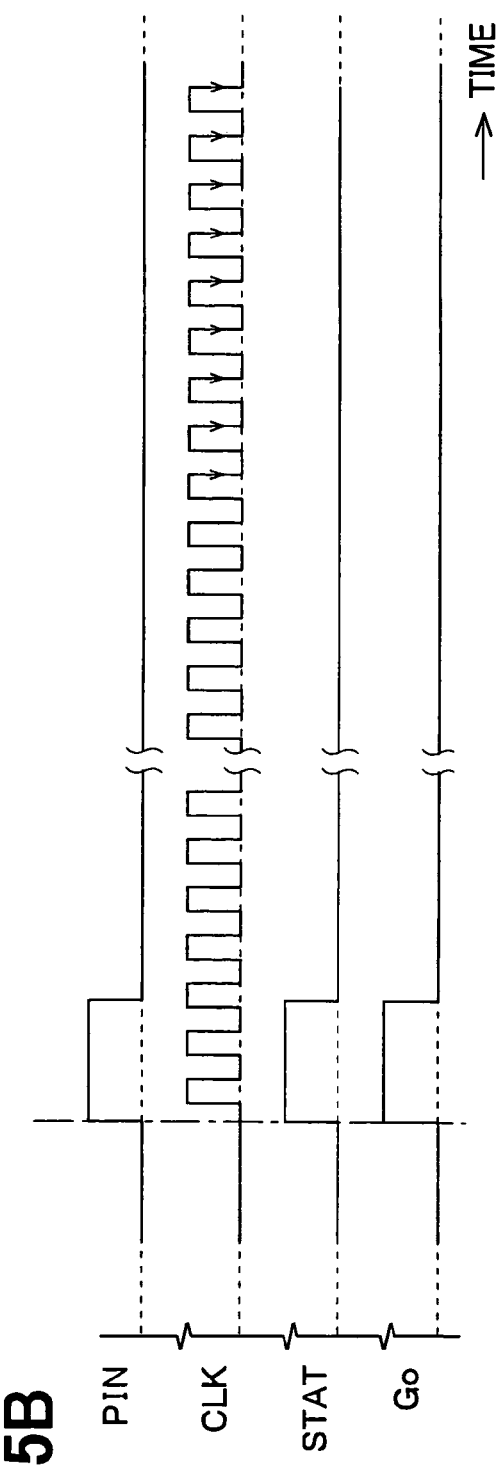

CAPACITIVE PHYSICAL QUANTITY SENSOR AND METHOD OF DIAGNOSING THE SAME

CROSS REFERENCE TO RELATED APPLICATION

This application is based on Japanese Patent Applications No. 2005-345308 filed on Nov. 30, 2005, and No. 2006-255723 filed on Sep. 21, 2006, the disclosures of which are incorporated herein by reference in its entirety.

BACKGROUND OF THE INVENTION

1. Field of the Invention

The present invention relates to a capacitive physical quantity sensor for detecting a physical quantity and a method of diagnosing the same. For example, the sensor may be used as an acceleration sensor, in which a capacitance formed between a movable electrode and a fixed electrode varies, when a physical quantity is applied.

2. Description of Related Art

U.S. Pat. No. 6,483,322 (corresponding to JP-A-2002-40047) discloses an acceleration sensor having a self-diagnostic function, as a capacitive sensor for detecting a physical quantity (dynamic amount). When the sensor is in a self-diagnostic mode, a voltage is applied between a movable electrode and a fixed electrode in the sensor. Thereby, the movable electrode is forcibly displaced and made to oscillate. The sensor performs a self-diagnosis about an abnormality generation by detecting an output of an acceleration signal corresponding to the oscillation.

Specifically, the sensor includes a control circuit, which applies a voltage for driving the movable electrode in order to detect an acceleration and perform the self-diagnosis. The control circuit includes an input terminal and a status (STAT) terminal corresponding to an output terminal. A personal identification number (PIN) signal for instructing the self-diagnosis is input into the input terminal, the STAT terminal outputs an identification (ID) signal for indicating which acceleration sensor is performing the self-diagnosis.

When the PIN signal is input into the input terminal, the self-diagnosis is performed by applying the voltage between the movable electrode and the fixed electrode. FIG. 11 is a timing chart showing a self-diagnostic operation by a conventional acceleration sensor. As shown in FIG. 11, when the PIN signal is set to a high level (Hi), a self-diagnostic mode starts, and an output signal Go of the acceleration sensor is set to Hi. At the same time, the STAT terminal is set to Hi, and a self-diagnosis starts. Then, after the PIN signal is set to a low level (Lo), an ID signal is output from the STAT terminal to indicate which acceleration sensor is performing the self-diagnosis.

However, when the PIN signal is set to Hi by external noises, e.g., electromagnetic noises, the output signal Go of the acceleration sensor is set to Hi, while the acceleration sensor is not in the self-diagnostic mode. This signal may indicate that an acceleration is applied, and an apparatus operating based on the acceleration sensor may malfunction.

SUMMARY OF THE INVENTION

In view of the foregoing and other problems, it is an object of the present invention to provide a capacitive physical quantity sensor having a self-diagnostic function and reducing a malfunction by external noises.

According to a first example of the present invention, a capacitive sensor for detecting a physical quantity (dynamic amount) includes a movable electrode and a fixed electrode, and a controlling circuit for applying a signal between the movable electrode and the fixed electrode. The controlling circuit includes an input terminal, an output terminal, and a time measuring means for measuring a time period. The controlling circuit measures the time period, for which an instruction signal for instructing a self-diagnosis is input into the input terminal. The controlling circuit performs the self-diagnosis, after the instruction signal continues for a predetermined time period.

According to a second example of the present invention, a method of diagnosing a capacitive physical quantity sensor includes an inputting step, a determining step, an instructing step and a diagnosing step. In the inputting step, a preparation signal is input into an input terminal of the capacitive physical quantity sensor for a first predetermined time. In the determining step, whether an output terminal of the capacitive physical quantity sensor has output a first output signal for the first predetermined time in response to the preparation signal or not is determined. In the instructing step, a self-diagnosis is instructed by inputting an instruction signal into the input terminal for a second predetermined time, if the output terminal is determined to have output the first output signal for the first predetermined time. In the diagnosing step, the capacitive physical quantity sensor is diagnosed to be normal, if the output terminal outputs a second output signal for the second predetermined time.

BRIEF DESCRIPTION OF THE DRAWINGS

The above and other objects, features and advantages of the present invention will become more apparent from the following detailed description made with reference to the accompanying drawings. In the drawings:

FIG. 5A is a timing chart showing an operation of the acceleration sensor in a self-diagnostic mode, and FIG. 5B is a timing chart showing an operation of the acceleration sensor when a PIN signal is instantaneously set to Hi by external noises in a non-self-diagnostic mode;

DETAILED DESCRIPTION OF PREFERRED EMBODIMENTS

First Embodiment

Figure 1:
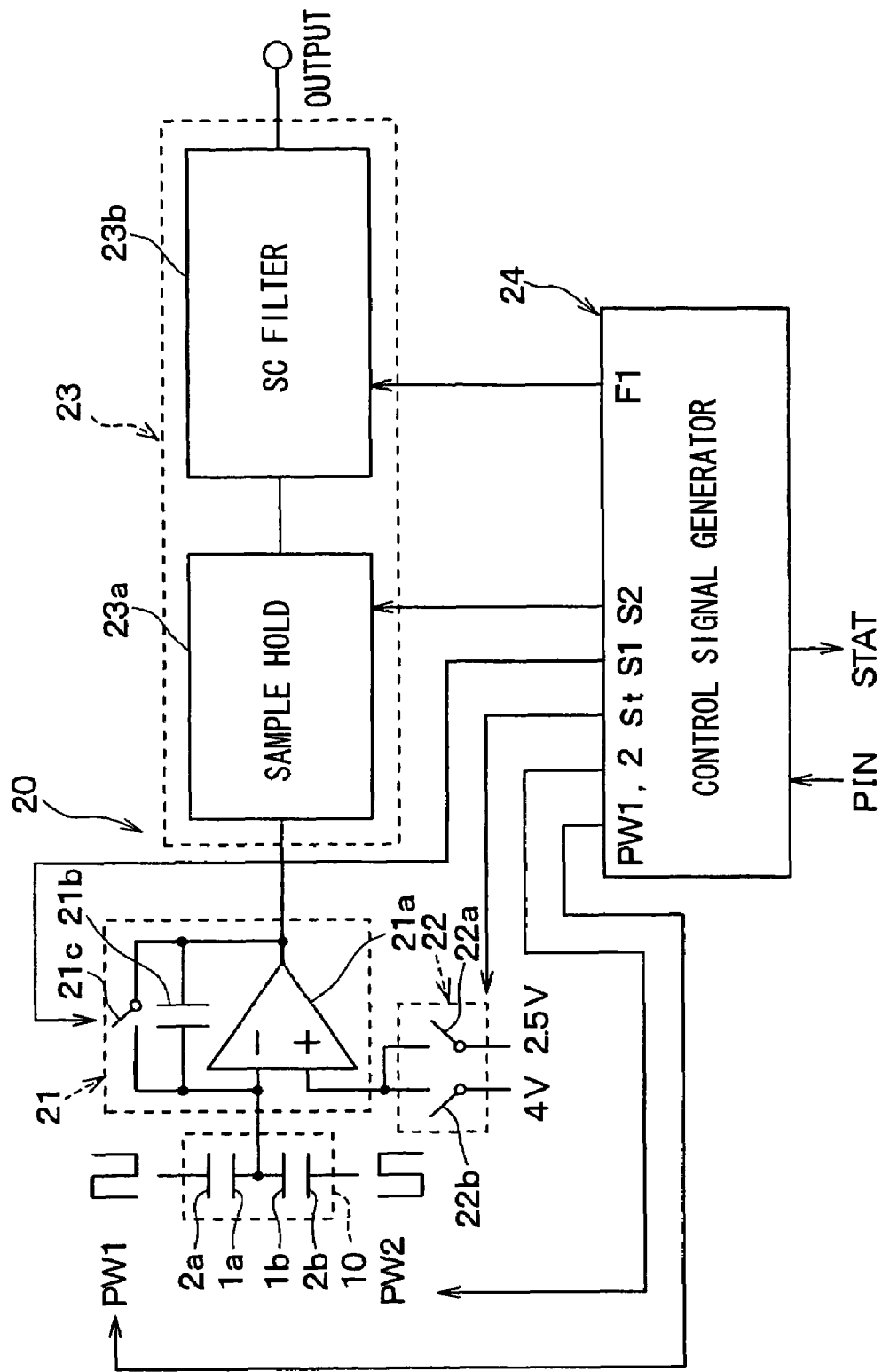
FIG. 1 is a block diagram for a capacitive acceleration sensor according to a first embodiment of the present invention.

As shown in FIG. 1, an acceleration sensor includes a sensor element 10 and a detecting circuit 20. The sensor element 10 includes movable electrodes 1a, 1b and fixed electrodes 2a, 2b. The detecting circuit 20 detects an acceleration based on a variation of a differential capacitance between the movable electrode 1a, 1b and the fixed electrode 2a, 2b.

The sensor element 10 includes a beam structure, and the movable electrode 1a, 1b and the fixed electrode 2a, 2b are constructed with the beam structure. The differential capacitance is formed by the movable electrode 1a, 1b and the fixed electrode 2a, 2b, which are positioned to face each other. A voltage is periodically applied to each of the fixed electrodes 2a, 2b, and the voltages applied to the fixed electrodes 2a, 2b are inverse to each other. Thereby, an acceleration is detected based on a variation of the differential capacitance, and the variation corresponds to a displacement of the movable electrodes 1a, 1b.

The detecting circuit 20 includes a capacitance-voltage (C-V) conversion circuit 21, a switch circuit 22, a signal processing circuit 23 and a control signal generating circuit 24.

The C-V conversion circuit 21 converts a variation of the differential capacitance into a voltage, and includes an operational amplifier 21a, a capacitor 21b and a switch 21c. An inverting input terminal of the amplifier 21a is connected to the movable electrodes 1a, 1b, and the capacitor 21b and the switch 21c are connected in parallel to the amplifier 21a between the inverting input terminal and an output terminal. The switch 21c is driven by a signal S1 from the control signal generating circuit 24. A non-inverting input terminal of the amplifier 21a is supplied with either of a half voltage Vcc/2 of a voltage Vcc applied to the fixed electrode 2a, 2b as a center voltage Vcc/2, or a voltage different from the center voltage as an offset voltage through the switch circuit 22. In this embodiment, the center voltage is 2.5V, and the offset voltage is 4V.

The switch circuit 22 inputs a voltage into the non-inverting input terminal of the amplifier 21a from a voltage source (not shown), and includes a first switch 22a and a second switch 22b. The first and second switches 22a, 22b are driven by a signal St from the control signal generating circuit 24. When one of the switches 22a, 22b is closed, the other switch is open.

The signal processing circuit 23 includes a sampling and holding (SH) circuit 23a and a switched capacitor filter (SCF) circuit 23b. The SH circuit 23a is driven by a signal S2 from the circuit 24. The SH circuit 23a samples an output from the C-V conversion circuit 21, and holds the output for a predetermined period. The SCF circuit 23b is driven by a clock signal F1 from the circuit 24. The SCF circuit 23b selects a signal in a predetermined frequency band component from the outputs of the SH circuit 23a, and outputs the signal as an acceleration signal.

The control signal generating circuit 24 outputs signals PW1, PW2 instructing a timing for applying a voltage to the fixed electrode 2a, 2b, the signal St instructing a timing for switching the switch circuit 22, the signal S1 instructing a timing for switching the switch 21c, the signal S2 for the SH circuit 23a and the signal F1 for the SCF circuit 23b.

Next, an operation of the acceleration sensor will be described. First, a normal acceleration-measuring operation will be described. In the normal operation, the switch 22a is closed and the switch 22b is open by the signal St from the circuit 24. Each of the output signals PW1, PW2 from the circuit 24 has a predetermined amplitude of a voltage Vcc (5V), and levels of the voltages Vcc of the output signals PW1, PW2 are inverse to each other. The signals PW1, PW2 have rectangular-wave shapes with the predetermined amplitude, and vary between a high level (Hi) and a low level (Lo) in four periods T1-T4 in each detection cycle.

In the first period T1, the signals PW1, PW2 set an electrical potential of the fixed electrode 2a to Vcc, and an electrical potential of the fixed electrode 2b to 0V. Further, the switch 21c is closed by the signal S1 from the circuit 24. Thus, the movable electrodes 1a, 1b have a bias voltage Vcc/2 by an operation of the amplifier 21a, and an electrical charge in the capacitor 21b is discharged, which will be a feedback capacitance. If a capacitance C1 between the movable electrode 1a and the fixed electrode 2a is larger than a capacitance C2 between the movable electrode 1b and the fixed electrode 2b (C1>C2), the movable electrodes 1a, 1b hold a large amount of negative charges, because of this relation and the voltages applied to the fixed electrodes 2a, 2b.

In the second period T2, the signals PW1, PW2 set the electrical potential of the fixed electrode 2a to Vcc, and the electrical potential of the fixed electrode 2b to 0V. Further, the switch 21c is opened by the signal S1. Thereby, the capacitor 21b is charged with electricity corresponding to a state of the movable electrodes 1a, 1b. Then, the C-V conversion circuit 21 outputs a voltage signal corresponding to the charge in the capacitor 21b, and the SH circuit 23a samples and holds the voltage signal in response to the signal S2.

In the third period T3, the signals PW1, PW2 set the electrical potential of the fixed electrode 2a to 0V, and the electrical potential of the fixed electrode 2b to Vcc. That is, the electrical potentials are interchanged. Further, the switch 21c is kept to be open by the signal S1. At this time, a state of the electrical charge in the movable electrodes 1a, 1b is inverse to that in the second period T2 due to an inversion of the signals PW1, PW2. That is, when the capacitance C1 is larger than the capacitance C2 (C1>C2), the movable electrodes 1a, 1b hold a large amount of positive charges due to an inversion of the voltages applied to the fixed electrodes 2a, 2b.

However, at this time, because a circuit between the movable electrode 1a, 1b and the capacitor 21b is closed, the electrical charges discharged in the first period T1 are stored in the circuit. Therefore, a part of the electrical charges is transferred and stored in the capacitor 21b for balance. Then, the C-V conversion circuit 21 outputs a voltage signal, which is proportional to the transferred charge, and inversely proportional to a capacitance C of the capacitor 21b, based on a relation Q=CV.

In the fourth period T4, the signals PW1, PW2 set the electrical potential of the fixed electrode 2a to 0V, and the electrical potential of the fixed electrode 2b to Vcc. After the voltage signal from the C-V conversion circuit 21 becomes sufficiently stable, the SH circuit 23a samples and holds the voltage signal from the C-V conversion circuit 21 in response to the signal S2.

The SH circuit 23a performs a differential calculation between the voltage signal sampled in the second period T2 and the voltage signal sampled in the fourth period T4, and outputs the calculated result. Based on the result, an acceleration corresponding to a displacement of the movable electrodes 1a, 1b can be detected.

Next, operations in a self-diagnostic mode and a case in which a personal identification number (PIN) signal is set to Hi by external noises in a non-self-diagnostic mode will be described. In the self-diagnostic mode, a PIN signal instructing a self-diagnosis is set to Hi in the control signal generating circuit 24. However, the PIN signal may also be set to Hi by external noises. When the PIN signal is set to Hi, the control signal generating circuit 24 determines whether the setting is caused by the instruction of the self-diagnosis or the external noises, based on clock signals CLK of a fixed frequency generated by a clock in the control signal generating circuit 24.

First, a time, for which the PIN signal is kept to Hi, is measured by counting the clock signals CLK. When the PIN signal is kept to Hi for a predetermined clock number (time), the signal St is changed from a normal acceleration-measuring mode to the self-diagnostic mode, synchronized with a rising or falling edge of the clock signal. If the PIN signal is changed to Lo in the predetermined clock number, the signal St is not changed so as to keep the normal acceleration-measuring mode.

The predetermined clock number represents a clock number corresponding to a time longer than an assumed time, for which the external noises continue. That is, when the time, for which the PIN signal is kept to Hi, exceeds the predetermined clock number, it is assumed that the PIN signal is set to Hi for a self-diagnosis, not by external noises. In contrast, when the time, for which the PIN signal is kept to Hi, is shorter than the predetermined clock number, it is assumed that the PIN signal is set to Hi by external noises.

Therefore, when the PIN signal is kept to Hi for the predetermined clock number, it is not assumed that the PIN signal is set to Hi by external noises, and the signal St is changed from the normal acceleration-measuring mode to the self-diagnostic mode. When the PIN signal is not kept to Hi for the predetermined clock number, it is assumed that the PIN signal is set to Hi by external noises, and the normal acceleration-measuring mode continues.

Then, when the self-diagnostic mode starts, the switch 22a is opened, and the switch 22b is closed in response to the signal St. Then, the offset voltage (4V) is applied to the operational amplifier 21a. At the same time, a potential difference is formed between the fixed electrodes 2a, 2b in response to the signals PW1, PW2. For example, a potential difference (4V) between the movable electrode 1b and the fixed electrode 2b is larger than a potential difference (1V) between the movable electrode 1a and the fixed electrode 2a, and an electrostatic force is increased. Thus, the movable electrodes 1a, 1b are forcibly displaced from a center point by the increased electrostatic force.

Subsequently, the switch circuit 22 closes the switch 22a and opens the switch 22b, in response to the signal St. Then, the center voltage of the fixed electrodes 2a, 2b is applied to the non-inverting input terminal of the operational amplifier 21a, similarly to the normal acceleration-measuring mode. Thereafter, operations similar to the above-described operations in the normal acceleration-measuring mode are performed, and an output corresponding to a displacement of the movable electrodes 1a, 1b is obtained. The displacement of the movable electrodes 1a, 1b by an electrostatic force has a specific value corresponding to a voltage applied to the non-inverting input terminal of the operational amplifier 21a. Therefore, the output corresponding to the displacement of the movable electrodes 1a, 1b is also a specific value. The self-diagnosis can be performed by comparing the obtained output with the specific output.

When the self-diagnosis is completed, an identification (ID) signal indicating which acceleration sensor completes the self-diagnosis is output from the STAT terminal, synchronized with the clock signal CLK, because a controlling device operating based on a result detected by the acceleration sensor may include multiple acceleration sensors. Thus, the controlling device can recognize which acceleration sensor has the result.

Figure 2:
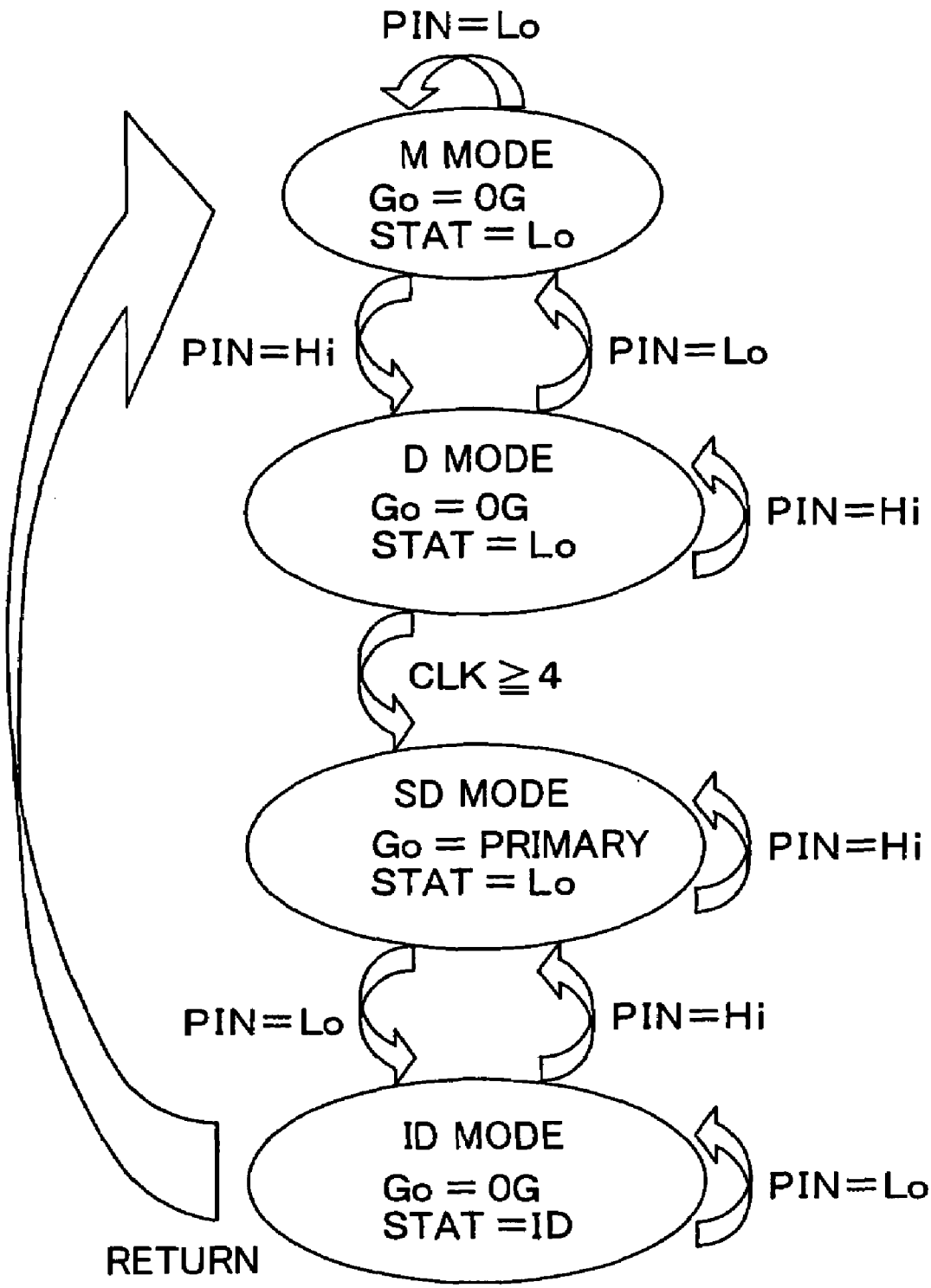
FIG. 2 is a state transition diagram for the acceleration sensor shown in FIG. 1.

As shown in FIG. 2, when the PIN signal is set to Lo, the acceleration sensor is in the normal acceleration-measuring mode (M mode). At this time, the output signal Go of the acceleration sensor indicates 0G basically. When an acceleration is applied to the sensor, the output signal Go indicates the corresponding value. An electrical potential of the STAT terminal is set to Lo. The clock continuously generates clock signals CLK.

When the PIN signal is set to Hi, the acceleration sensor is transferred to a determining mode (D mode). In this mode, a necessity of a self-diagnosis is determined by comparing a time, for which the PIN signal is kept to Hi, with a time corresponding to the predetermined clock number. At this time, the output signal Go indicates 0G, and the electrical potential of the STAT terminal is set to Lo. As long as the PIN signal is set to Hi, the determining mode continues. When the PIN signal is changed to Lo, the acceleration sensor returns to the M mode.

When the predetermined clock number, e.g., four clocks in this embodiment, of the clock signals CLK is counted in the determining mode, the acceleration sensor is transferred to the self-diagnostic mode (SD mode). Then, the self-diagnosis is performed, and the output signal Go of the acceleration sensor is set to the corresponding value (a primary value). As long as the PIN signal is set to Hi, the SD mode continues. In contrast, when the PIN signal is set to Lo, the acceleration sensor is transferred to the ID output mode (ID mode).

Basically, in the ID mode, the output signal Go of the acceleration sensor indicates 0G, and an ID signal is output from the STAT terminal, synchronized with a clock signal CLK. As long as the PIN signal is set to Lo, the ID mode continues. In contrast, when the PIN signal is set to Hi, the acceleration sensor is returned to the SD mode again. When the output of the ID signal is completed, the self-diagnosis is determined to be finished, and the acceleration sensor is transferred to the M mode again.

Figure 3A:
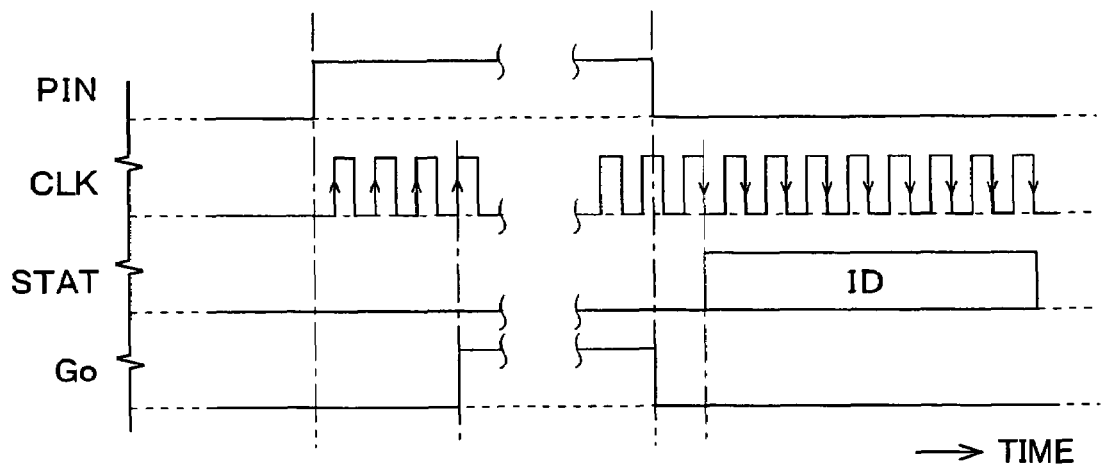
FIG. 3A is a timing chart showing an operation of the acceleration sensor in a self-diagnostic mode.
Figure 3B:
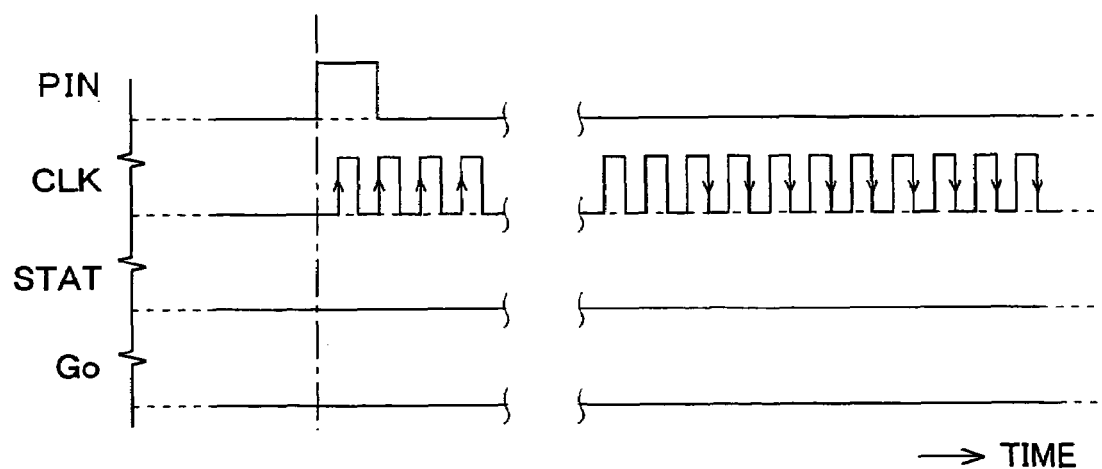
FIG. 3B is a timing chart showing an operation of the acceleration sensor when a PIN signal is instantaneously set to Hi by external noises in a non-self-diagnostic mode.

As shown in FIG. 3A, when the PIN signal continues to be Hi for the predetermined clock number, the self-diagnosis is performed, and the acceleration sensor outputs the output signal Go corresponding to the self-diagnostic result. In contrast, as shown in FIG. 3B, when the PIN signal is instantaneously set to Hi by external noises, the self-diagnosis is not performed, because the PIN signal does not continue to be Hi for the predetermined clock number. Then, the output signal Go of the acceleration sensor is set to 0G.

According to the first embodiment, the acceleration sensor can be transferred to the self-diagnostic mode, only when the PIN signal continues to be Hi for the time longer than the assumed time, for which external noises continue. Thereby, even when the PIN signal is set to Hi by external noises, it is not erroneously detected that an acceleration is applied to the sensor. Thus, a malfunction of an external apparatus operating in response to the acceleration sensor can be reduced.

Second Embodiment

In a second embodiment, whether a PIN signal is set to Hi by a signal instructing a self-diagnosis or external noises is determined by using plural PIN signals. The other parts may be made similar to the first embodiment, and a description of the other parts will be omitted.

In a self-diagnostic mode, the signal instructing a self-diagnosis, i.e., PIN signal, is set to Hi in the control signal generating circuit 24. In contrast, the PIN signal may be set to Hi by external noises. When the PIN signal is set to Hi, whether the PIN signal is set to Hi by the signal instructing the self-diagnosis or external noises is determined by using clock signals CLK generated by the clock in the circuit 24.

First, when the PIN signal is set to Hi, signals are output from the circuit 24 and the output potential of the STAT terminal is set to Hi synchronized with the rising of the PIN signal. Specifically, operations similar to those in the self-diagnostic mode described in the first embodiment are performed in response to the signals output from the circuit 24.

Thus, operations in the normal self-diagnostic mode are performed. However, at this time, whether the operations are performed by the signal instructing the self-diagnosis or external noises cannot be determined. The indetermination is determined based on an output (Hi) of the STAT terminal, and an output from the acceleration sensor is not used in the self-diagnosis. That is, although operations in the self-diagnostic mode are performed, an entry into the self-diagnostic mode is not performed at this time.

In case of a self-diagnosis, the PIN signal is set to Hi again after a certain interval. In contrast, external noises set the PIN signal to Hi at random times (discontinuously). Therefore, PIN signals are regularly set to Hi multiple times for a self-diagnosis. Thus, a case in which the PIN signal is set to Hi by external noises can be distinguished.

Then, the acceleration sensor operation mode is changed to the self-diagnostic mode again, and a real (second) self-diagnosis is performed. At this time, the STAT terminal is not set to Hi. Thereby, the output of the STAT terminal is changed relative to that in the first self-diagnosis, and whether the acceleration sensor is in the self-diagnostic mode or not can be determined by reading the output of the STAT terminal. After the second self-diagnosis is completed, the ID signal is output from the STAT terminal.

Figure 4:
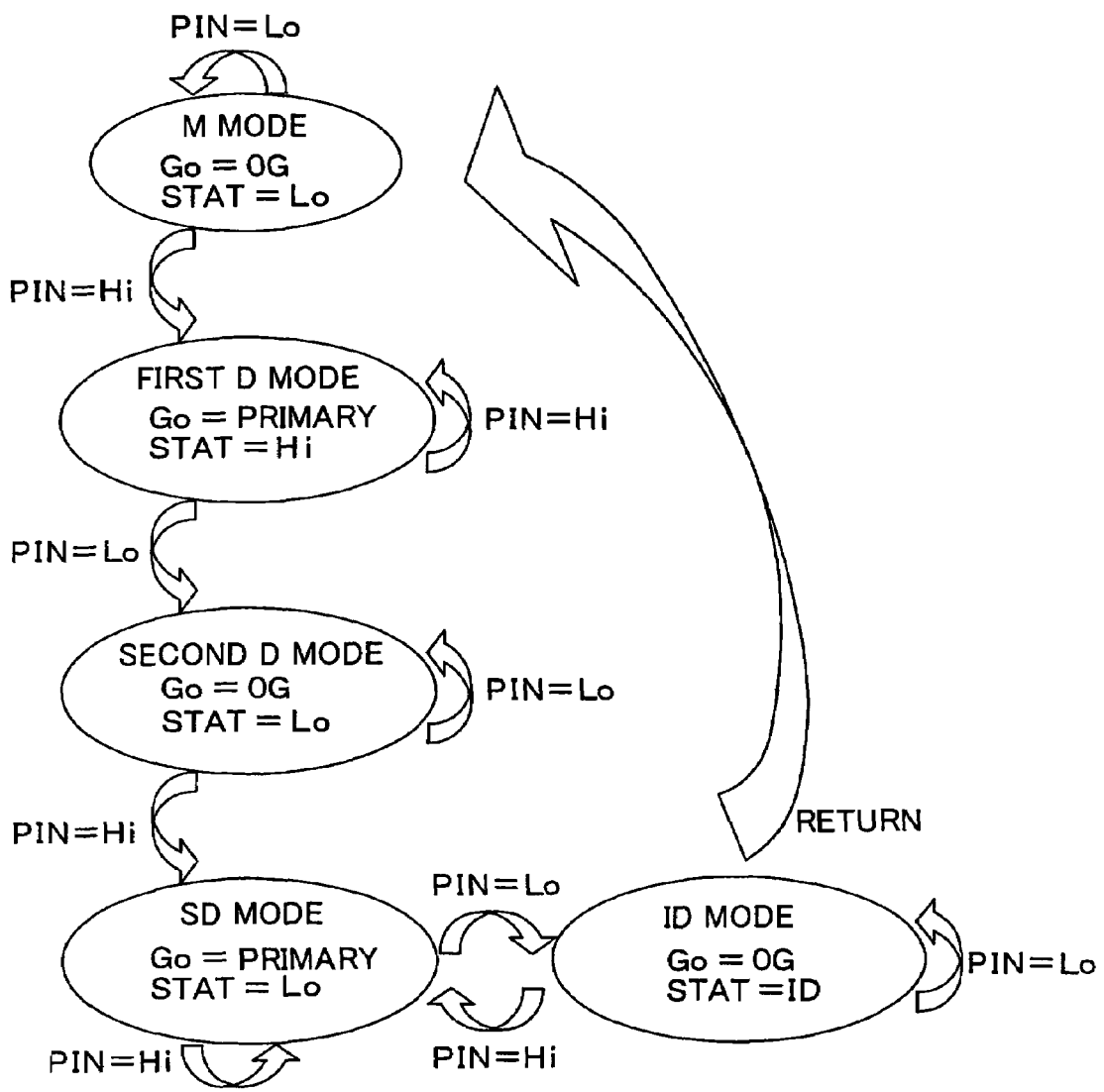
FIG. 4 is a state transition diagram for a capacitive acceleration sensor according to a second embodiment of the present invention.

As shown in FIG. 4, when the PIN signal is set to Lo, the acceleration sensor is in the normal acceleration-measuring mode (M mode). At this time, the output signal Go of the acceleration sensor indicates 0G basically. When an acceleration is applied to the sensor, the output signal Go indicates the corresponding value. Further, an electrical potential of the STAT terminal is set to Lo. The clock continuously generates clock signals CLK.

When the PIN signal is set to Hi, the operation mode is changed to a first determining mode (first D mode). Then, the self-diagnosis is performed, and the output signal Go of the acceleration sensor is set to the corresponding value (a primary value). Further, the output of the STAT terminal is set to Hi. As long as the PIN signal continues to be Hi, the first determining mode continues. When the PIN signal is changed to Lo, the operation mode is changed to a second determining mode (second D mode).

In the second determining mode, the output signal Go of the acceleration sensor indicates 0G basically, and the electrical potential of the STAT terminal is set to Lo. As long as the PIN signal continues to be Lo, the second determining mode continues. When the PIN signal is changed to be Hi, the operation mode is changed to the self-diagnostic mode (SD mode). In addition, when the second determining mode continues for the predetermined time, the sensor is returned to the M mode. The predetermined time represents the time, in which PIN signals are assumed to set to Hi plural times. In this case, even when the PIN signal is set to Hi again, the operation mode is changed to the first determining mode, not to the second determining mode.

In the SD mode, the self-diagnosis is performed, and the output signal Go of the acceleration sensor is set to the corresponding value (a primary value). At this time, the electrical potential of the STAT terminal is set to Lo. As long as the PIN signal continues to be Hi, the SD mode continues. When the PIN signal is changed to Lo, the operation mode is changed to an ID output mode (ID mode).

In the ID mode, the output signal Go of the sensor indicates 0G basically, and the ID signal is output from the STAT terminal synchronized with the clock signal CLK. As long as the PIN signal continues to be Lo, the ID mode continues. When the PIN signal is changed to Hi, the self-diagnosis is completed, and the sensor is returned to the M mode again.

As shown in FIG. 5A, in the self-diagnostic mode, PIN signals are set to Hi twice, and the self-diagnosis is performed when the PIN signal is set to Hi again. Thus, the output signal Go corresponding to a result of the self-diagnosis is output from the sensor. In contrast, as shown in FIG. 5B, the PIN signal is set to Hi once by external noises. That is, the PIN signal is not set to Hi twice, and the self-diagnosis is not performed. Then, the output signal Go of the sensor is set to 0G.

Accordingly, when PIN signals are repeatedly set to Hi, the self-diagnosis is performed. In contrast, when PIN signals are not repeatedly set to Hi, the PIN signal is determined to set to Hi by external noises. Advantages provided by the first embodiment can also be provided by the second embodiment.

Third Embodiment

In a third embodiment, an acceleration sensor has two sensitivities for a single axis direction. The other parts may be made similar to the first embodiment, and a description of the other parts will be omitted.

Figure 6:
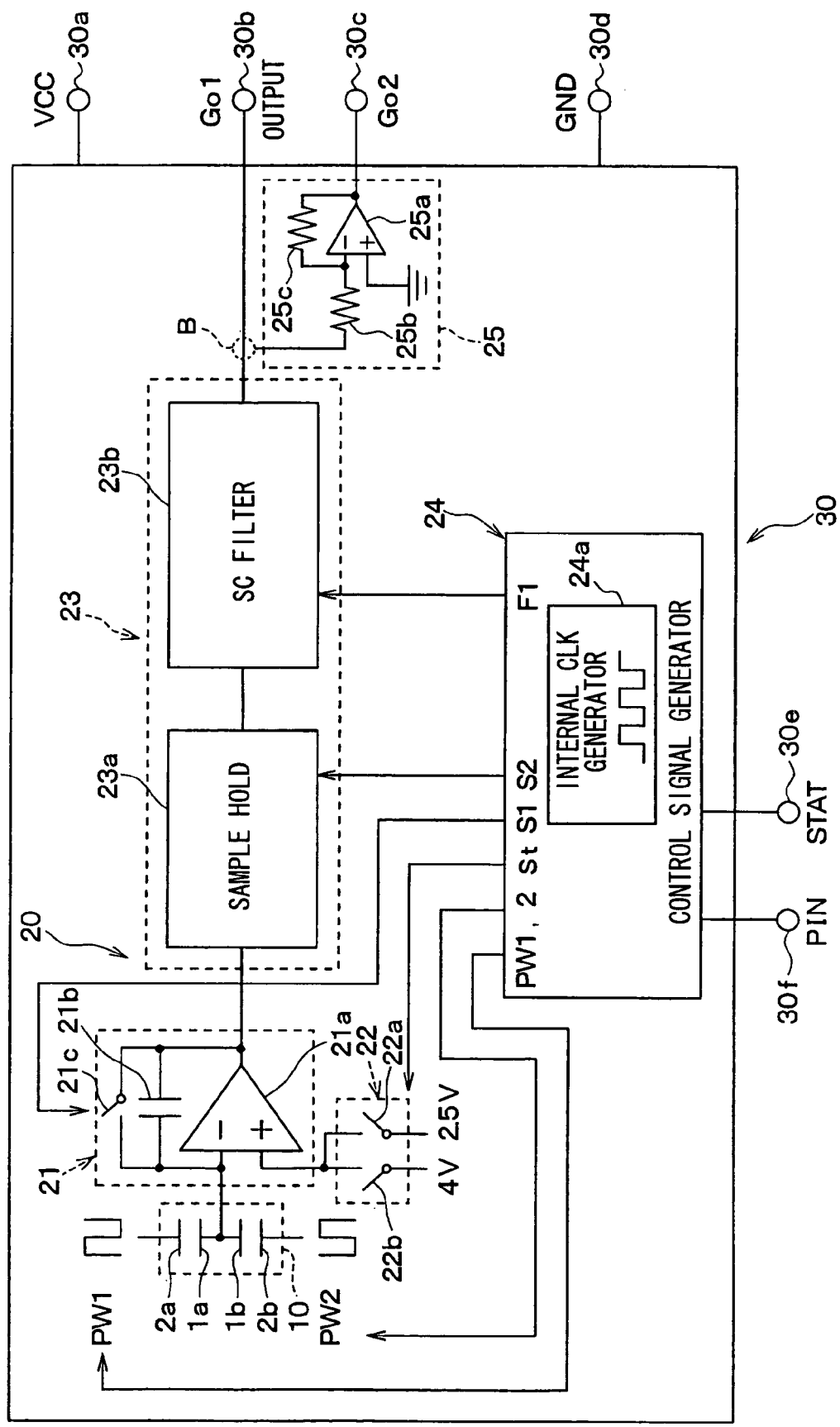
FIG. 6 is a block diagram showing a package IC for an acceleration sensor according to a third embodiment.

As shown in FIG. 6, a package integrated circuit (IC) 30 (pressure sensor) includes a sensor element 10, a C-V conversion circuit 21, a switch circuit 22, a signal processing circuit 23 and a control signal generating circuit 24. The IC 30 further includes a power source terminal 30a, a first output terminal 30b, a second output terminal 30c, a ground (GND) terminal 30d, a STAT terminal 30e and an input terminal 30f. These six terminals 30a-30f correspond to lead frames 35 to be described below. The power source terminal 30a supplies the IC 30 with a driving voltage VCC. The first output terminal 30b outputs an output signal Go1. The second output terminal 30c outputs an output signal Go2. The GND terminal 30d is connected to a reference potential GND of the IC 30. The STAT terminal 30e outputs a signal indicating a state of the acceleration sensor. A PIN signal for instructing a self-diagnosis is input into the input terminal 30f.

Figure 7A:
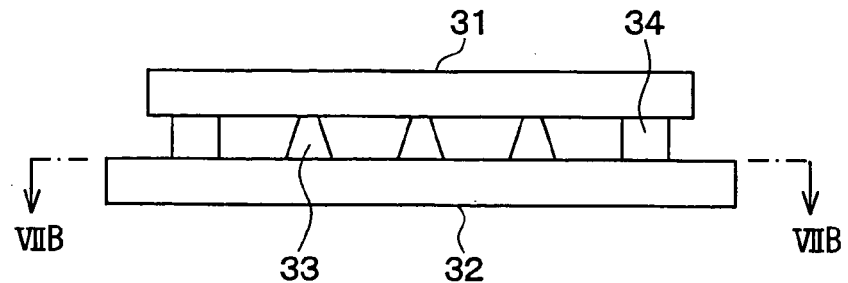
FIG. 7A is a side view showing a mounting structure of the acceleration sensor.

As shown in FIG. 7A, a substrate 31 and a package 32 are connected in the acceleration sensor. The substrate 31 is formed by layering a substrate for a sensor circuit having the sensor element 10 on a substrate for the detecting circuit 20. The substrate for the detecting circuit 20 includes the C-V conversion circuit 21, the switch circuit 22, the signal processing circuit 23 and the control signal generating circuit 24.

Figure 7B:
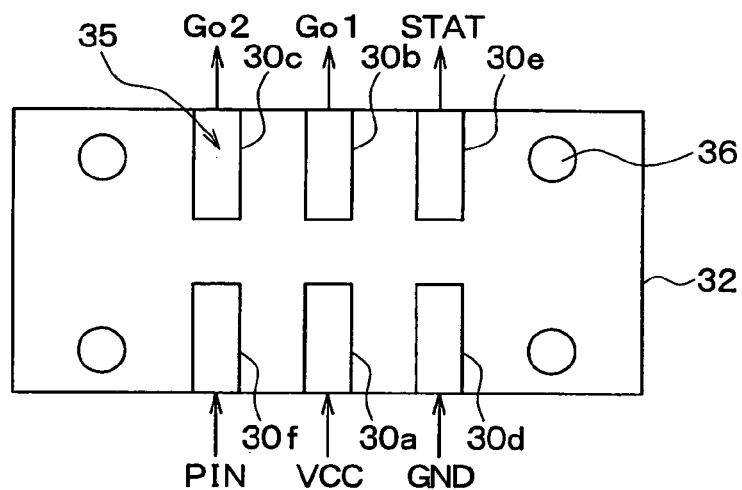
FIG. 7B is a plan view of the package IC taken along line VIIB-VIIB in FIG. 7A.

As shown in FIGS. 7A and 7B, six main electrodes 33 are disposed on a face of the substrate 31, and faced to the package 32. Similarly, six lead frames 35 are disposed on the package 32 so as to correspond to the six electrodes 33. Each of the lead frames 35 corresponds to each of the terminals 30a-30f.

The main electrodes 33 and the lead frames 35 are connected through bumps. A connection by the bump is not damaged, even when a stress, e.g., thermal stress, is generated from the package 32 to the substrate 31. This is because a solder is mounted to the connection part, and the connection part is formed into a shape having a high wetting performance. Specifically, an area of the solder on the package 32 is larger than that on the substrate 31.

Four subsidiary electrodes 34 are disposed at four corners of the substrate 31, other than the main electrodes 33. Four dummy pads 36 are disposed at four corners of the package 32 so as to correspond to the subsidiary electrodes 34. The subsidiary electrodes 34 and the dummy pads 36 are connected through bumps. Each of the subsidiary electrodes 34 has an area of a solder on the package 32, which is equal to that on the substrate 31. This is different from a case of the main electrodes 33. When the package 32 is thermally deformed, a thermal stress is rarely applied to the substrate 31 due to the subsidiary electrodes 34. Thereby, when a stress is generated in the package 32, the main electrodes 33 are protected from being separated from the lead frames 35, and the stress is decreased due to the subsidiary electrodes 34.

As shown in FIG. 6, the control signal generating circuit 24 includes an internal clock generating circuit 24a, and outputs signals PW1, PW2, St, S1, S2 and F1 synchronized with clock signals generated by the internal clock generating circuit 24a. That is, the acceleration sensor does not require clock signals from an outside of the package IC 30.

The acceleration sensor has two sensitivities for a single axis direction. However, the sensor includes only the single sensor element 10 to be a sensing part, as shown in FIG. 6. The acceleration sensor in the third embodiment is different from those in the above-described embodiments in that a branch circuit 25 is disposed at the output side of the SCF circuit 23b.

The branch circuit 25 amplifies an output signal from the SCF circuit 23b, and forms the output signal Go2. The branch circuit 25 includes an amplifying circuit having an operational amplifier 25a and resistors 25b, 25c. The resistor 25b is disposed between an output terminal of the SCF circuit 23b and an inverting input terminal of the operational amplifier 25a. The resistor 25c is disposed between the inverting input terminal and an output terminal of the operational amplifier 25a.

A signal output from the SCF circuit 23b is branched at a point B. One branched signal is output as the output signal Go1, and the other branched signal is output as the output signal Go2 after being amplified by the branch circuit 25. Therefore, the acceleration sensor has two sensitivities for a single axis direction, because an amplification degree of the output signal Go1 is different from that of the output signal Go2. In addition, the output signal Go2 is amplified in a direction inverting to the output signal Go1, because the branch circuit 25 is an inversely amplifying circuit. Thus, the output signals Go1 and Go2 can be distinguished from each other.

Figure 8:
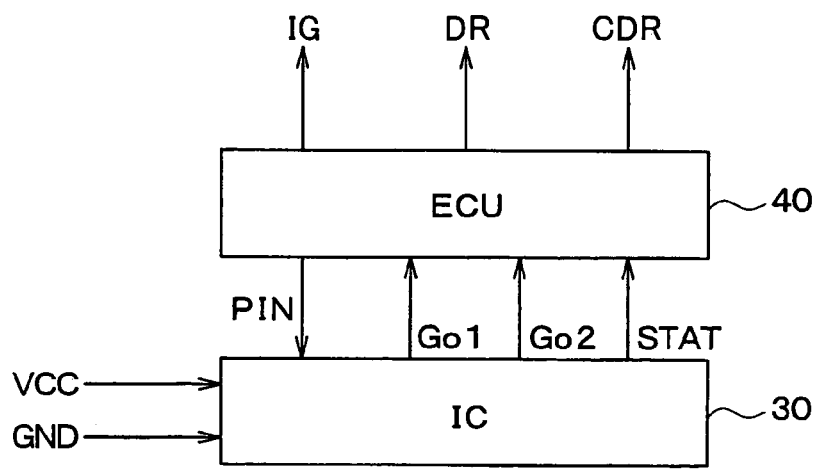
FIG. 8 is a diagram showing input/output signals of the package IC and an ECU.

As shown in FIG. 8, the driving voltage VCC, the reference potential GND and the PIN signal are input into the IC 30 of the acceleration sensor, and the output signals Go1, Go2 and STAT are output from the IC 30 of the acceleration sensor, as described above. The output signals Go1, Go2 and STAT are transmitted to an electric control unit (ECU) 40, e.g., airbag ECU, through a bus in an automobile.

The ECU 40 includes a clock generating circuit therein. The clock generating circuit is not synchronized with the internal clock generating circuit 24a in the control signal generating circuit 24, and driven so as to have a controlling period of 1 msec. For example, in a case in which the ECU 40 is an airbag ECU, when the ECU 40 receives an ignition (IG) signal output from a key cylinder portion (not shown), the ECU 40 outputs the PIN signal to the acceleration sensor. Afterward, when the ECU 40 receives the output signals Go1, Go2 and STAT from the acceleration sensor, the ECU 40 outputs a diagnostic result (DR) or a collision determining result (CDR) in response to the output signals.

The collision determining result is determined based on outputs from acceleration sensors disposed in an automobile. Specifically, the collision determining result indicates whether airbags are to be inflated or not in a collision with an object. This is determined based on an output of an acceleration sensor at a normal acceleration-measuring mode. In contrast, the diagnostic result is a result of a self-diagnostic process, which is performed when the ECU 40 receives the IG signal. Specifically, the diagnostic result represents a result of a determination based on an output of an acceleration sensor, when movable electrodes 1a, 1b are displaced by applying a voltage to the sensor element 10.

When an IG signal output from the key cylinder portion is input into the ECU 40, a self-diagnostic process starts after a predetermined initializing process is completed. The self-diagnostic process is synchronized with a predetermined controlling period.

Figure 9:
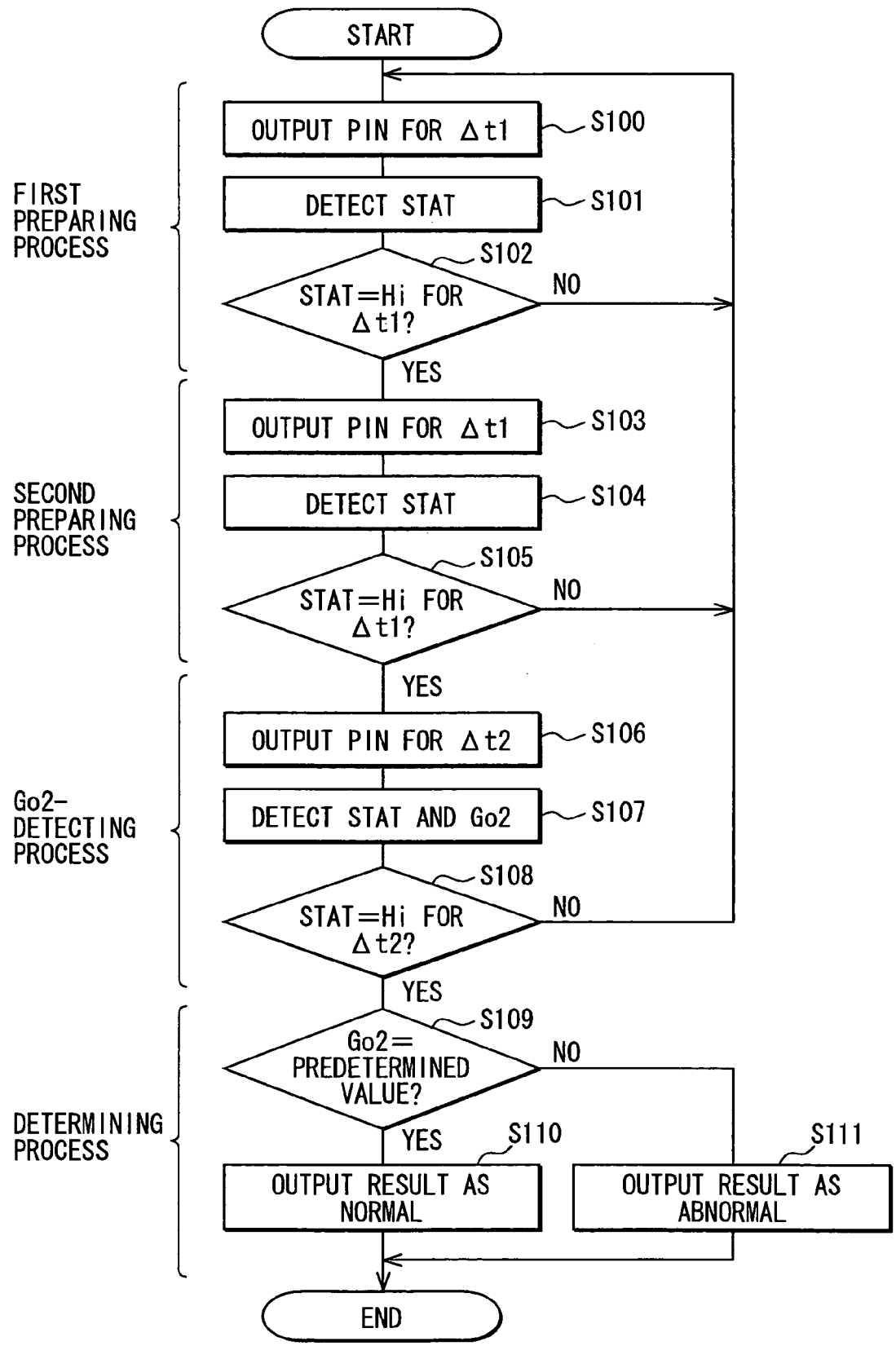
FIG. 9 is a flow chart for a self-diagnostic process.

As shown in FIG. 9, at S100, a PIN signal Hi is output for a predetermined time $\Delta t1$. The predetermined time $\Delta t1$ is longer than the assumed time, for which noises affecting a communication system of an automobile continue. Because the noises have a frequency in a range of gigahertz (GHz), it is assumed that the noises continue for about 1-500 nsec. Therefore, the predetermined time $\Delta t1$ is set to 0.25 msec such that the noises are not erroneously detected as the PIN signal. The predetermined time $\Delta t1$ may be in a range between 0.1 msec and 0.5 msec. That is, the predetermined time $\Delta t1$ has a margin multiplied by about 5-500 relative to the assumed time.

Figure 10:
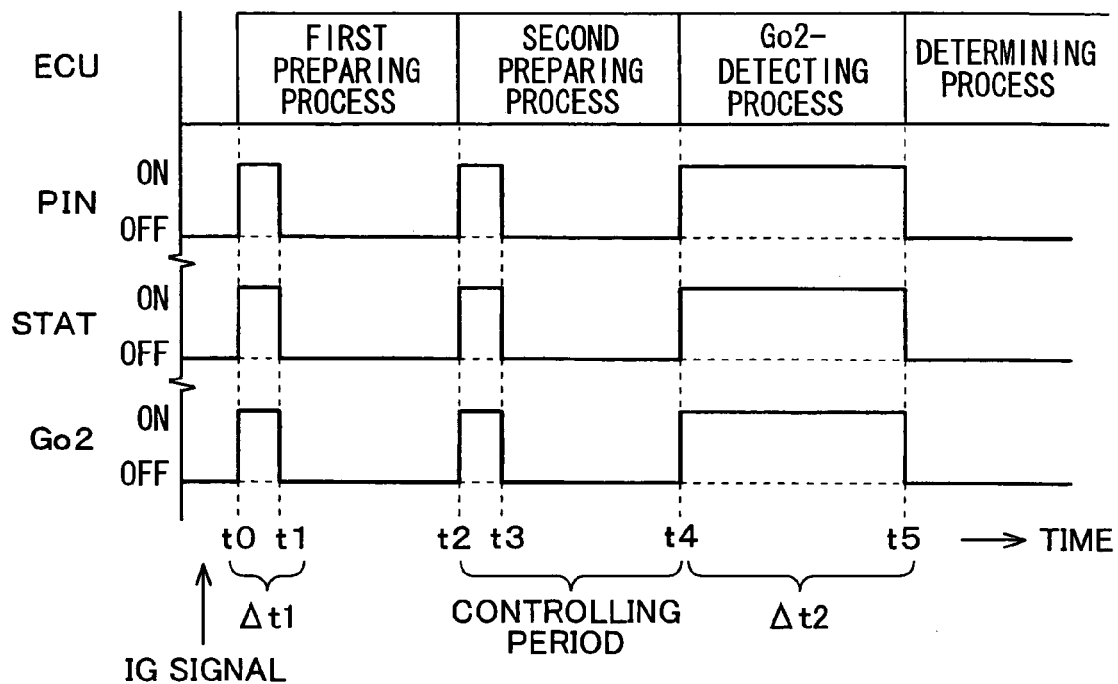
FIG. 10 is a timing chart for the self-diagnostic process.
Figure 11:
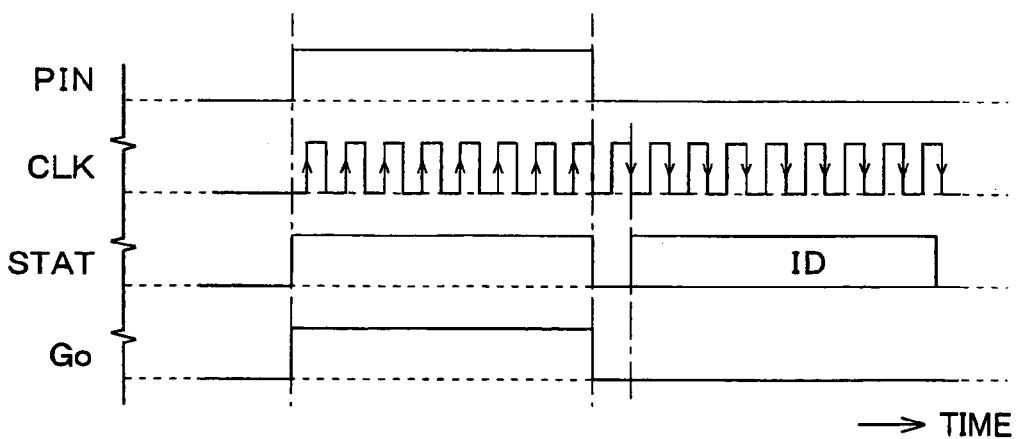
FIG. 11 is a timing chart showing an operation of a self-diagnosis by a conventional acceleration sensor.

Thereby, as shown in a time period t0-t2 in FIG. 10, the STAT terminal 30e outputs a signal indicating a state of the IC 30 to the ECU 40, and the second output terminal 30c outputs the output signal Go2 to the ECU 40. At this time, because the PIN signal continues for the predetermined time $\Delta t1$, the STAT terminal 30e and the second output terminal 30c continue to be Hi for the predetermined time $\Delta t1$.

At S101 in FIG. 9, the output potential of the STAT terminal 30e and the output signal Go2 of the second output terminal 30c in the time period t0-t2 are detected, and the respective times of Hi are calculated. In a normal case, the continuing time is equal to the predetermined time $\Delta t1$.

At S102, a determination is performed based on the continuing time, for which the STAT terminal 30e continues to be Hi. If the continuing time is equal to the predetermined time $\Delta t1$, the PIN signal is determined to be normally input in the acceleration sensor, and the ECU 40 performs S103. In contrast, if the continuing time is less than the predetermined time $\Delta t1$, the PIN signal is determined not to be normally input in the acceleration sensor, and the ECU 40 performs S100 again.

At S103, the PIN signal of Hi is output for the predetermined time $\Delta t1$ again. Thereby, in a time period t2-t4 in FIG. 10, similarly to the time period t0-t2, the STAT terminal 30e outputs a signal indicating a state of the acceleration sensor to the ECU 40, and the second output terminal 30c outputs the output signal Go2 to the ECU 40.

At S104, the output potential of the STAT terminal 30e and the output signal Go2 of the second output terminal 30c in the time period t2-t4 are detected, and the times of Hi signal are calculated.

At S105, a determination is performed based on the continuing time, for which the STAT terminal 30e continues to be Hi. If the continuing time is equal to the predetermined time $\Delta t1$, the PIN signal is determined to be normally input in the acceleration sensor, and the ECU 40 then performs S106. In contrast, if the continuing time is less than the predetermined time Δt1, the PIN signal is determined not to be normally input in the acceleration sensor, and the ECU 40 performs S100 again.

The steps S100-102 are in a first preparing process, and the steps S103-105 are in a second preparing process. After the first and second preparing processes are normally completed, the ECU 40 performs a Go2-detecting process S106-108 and a determining process S109-111 in order to perform a diagnostic determination.

At S106, the PIN signal of Hi is output for a predetermined time Δt2. Then, at S107, the output potential of the STAT terminal 30e and the output signal Go2 of the second output terminal 30c in a time period t4-t5 are detected. The time period t4-t5 is equal to the predetermined time Δt2.

At S108, a determination is performed based on the output potential of the STAT terminal 30e. If the output potential continues to be Hi for the predetermined time Δt2, the PIN signal is determined to be normally input in the acceleration sensor, and the ECU 40 then performs S109. In contrast, if the output potential continues to be Hi less than the predetermined time Δt2, the PIN signal is determined not to be normally input in the acceleration sensor, and the ECU 40 performs S100 again.

At S109, a determination is performed based on the output signal Go2 detected at S107. If the output signal Go2 is determined to be equal to a predetermined value, the ECU 40 performs S110. In contrast, if the output signal Go2 is determined to be not equal to the predetermined value, the ECU 40 then performs S111. The predetermined value represents a value to be output by the acceleration sensor as the output signal Go2, when the PIN signal continues to be Hi for the predetermined time Δt2 and the acceleration sensor detects the PIN signal.

At S110, the ECU 40 outputs a diagnostic result that the acceleration sensor is normal, because the output signal Go2 is determined to be equal to the predetermined value. In contrast, at S111, the ECU 40 outputs a diagnostic result that the acceleration sensor is not normal (abnormal), because the output signal Go2 is determined to be not equal to the predetermined value.

In addition, in the timing chart shown in FIG. 10, the rising edge and the falling edge of the output potential of the STAT terminal 30e and the output signal Go2 are synchronized with those of the PIN signal. However, practical responses of the output potential of the STAT terminal 30e and the output signal Go2 may be slightly delayed relative to the PIN signal.

According to the third embodiment, the acceleration sensor is not driven to a self-diagnostic mode, when the PIN signal is set to Hi by external noises, similarly to the first and second embodiments. Further, a following advantage can be provided, because the clock signals CLK are generated by the internal clock generating circuit 24a in the control signal generating circuit 24. This advantage will be described by using a package IC of an acceleration sensor having a conventional structure.

A conventional acceleration sensor package having one sensitivity for a single axis direction includes six main electrode and lead frames, similarly to this embodiment. These are used for transmission of the voltage VCC, the output signal Go, the reference potential GND, the output potential of the STAT terminal, the PIN signal and the clock signal CLK. The SH circuit and the SCF circuit in the signal processing circuit are driven in response to the clock signal CLK input from the main electrodes. Therefore, in order to change the conventional acceleration sensor to the acceleration sensor having two sensitivities for a single axis direction in this embodiment, not only the branch circuit 25 but also another main electrode and lead frame are required for another output port. However, if the main electrodes 33 are increased from six to seven, a shape of the package IC 30 is required to change. Then, a compatibility with the conventional structure cannot be kept. Further, a body size of the package IC 30 may be increased.

In contrast, according to the third embodiment, the clock signals CLK are generated by the internal clock generating circuit 24a in the circuit 24, and one of the main electrodes 33 used for inputting the clock signals CLK can be used as the second output terminal 30c. The output signal Go2 can be output from the second output terminal 30c. Thereby, the acceleration sensor having two sensitivities for a single axis direction can be formed by using the conventional package.

Moreover, at S109 in FIG. 9, the self-diagnosis of the acceleration sensor can be performed, in which the added branch circuit 25 is included, because the acceleration sensor is determined to be normal or not based on the output signal Go2. Therefore, the same advantages can be provided in the acceleration sensor having two sensitivities for a single axis direction in this embodiment as the first and second embodiments. Both of the output signals Go1, Go2 can be determined to be normal or not at one determination, because the self-diagnosis is performed based on the output signal Go2, which is formed by amplifying the output signal Go1. Further, it is not required that the output signals Go1, Go2 are separately determined.

In the above self-diagnostic process, the PIN signal continues to be Hi for the predetermined time Δt1, and the time, for which the output potential of the STAT terminal 30e continues to be Hi, is determined to be equal to the predetermined time Δt1. Alternatively, a ratio of time, for which the PIN signal is set to be Hi in total, to one controlling period, i.e., a duty ratio by a pulse-width modulation (PWM) style, may be used in place of the predetermined time Δt1. This is because the ECU 40 uses a pulse clock for its time management. For example, a duty ratio of the PIN signal may be set to 50% at S100, and a duty ratio, in which the output potential of the STAT terminal 30e is set to be Hi, may be determined to be 50% at S102.

Other Embodiments

In the above embodiments, the acceleration sensors are described as a capacitive sensor for detecting a physical quantity (dynamic amount). Alternatively, other sensors, e.g., a pressure sensor or a yaw rate sensor, may be used as the capacitive sensor. Further, the switch circuit 22 and the control signal generating circuit 24 may be integrated as a controlling unit.

Such changes and modifications are to be understood as being within the scope of the present invention as defined by the appended claims.

What is claimed is:

1. A capacitive sensor for detecting a physical quantity, the sensor comprising:

a movable electrode and a fixed electrode; and a controlling unit for applying a signal between the movable electrode and the fixed electrode, the controlling unit including an input terminal, into which an instruction signal for instructing a self-diagnosis is input, an output terminal, which outputs an indication signal for indicating a state of the self-diagnosis, and a time measuring means for measuring a time period, for which the instruction signal is input into the input terminal, wherein the controlling unit performs the self-diagnosis, after the instruction signal continues for a predetermined time period, the time measuring means measures the time period by using a clock for generating clock signals;

the predetermined time period corresponds to a time longer than a time for which it is assumed that external noise will continue, the sensor is included in an automobile, and the predetermined time is between 0.1 and 0.5 ms.

2. The sensor according to claim 1, further comprising:

a C-V conversion circuit, which outputs a voltage corresponding to a variation of a capacitance formed by the movable electrode and the fixed electrode; and a signal processing circuit, which outputs a signal corresponding to a variation of the physical quantity by processing the voltage from the C-V conversion circuit, wherein the movable electrode is displaced in accordance with the variation of the physical quantity, the controlling unit periodically applies a detection signal for detecting the variation of the capacitance in a normal measuring mode, and the controlling unit applies a displacement signal for displacing the movable electrode before applying the detection signal in a self-diagnostic mode.

3. The sensor according to claim 1, wherein:

the controlling unit performs the self-diagnosis, in a case in which a plurality of instruction signals is input into the input terminal, and the self-diagnosis is not performed, in a case in which the instruction signals are not input into the input terminal.

4. The sensor according to claim 1, wherein: the controlling unit outputs the indication signal from the output terminal, when the instruction signal is finished clue to a completion of the self-diagnosis.

5. The sensor according to claim 3, wherein:

the controlling unit performs the self-diagnosis, in a case in which a first instruction signal and a second instruction signal are input into the input terminal, and the controlling unit prohibits the self-diagnosis, in a case in which only the first instruction signal is input into the input terminal.

6. The sensor according to claim 5, wherein: the controlling unit recognizes the second instruction signal as a first instruction signal, if the second instruction signal is input into the input terminal after a predetermined time since the first instruction signal is input.

7. The sensor according to claim 5, wherein: the output terminal outputs different signals between cases, in which the first instruction signal is input, and in which the second instruction signal is input.

8. The sensor according to claim 6, wherein: the predetermined time is longer than an assumed time, in which the second instruction signal is input.

9. A capacitive sensor for detecting a physical quantity, the sensor comprising:

a single sensing element including a movable electrode and a fixed electrode and responding to a physical quantity applied thereto when a periodic signal is applied thereto;

a signal processing circuit connected to the single sensing element to produce a sensor signal corresponding to a responding operation of the single sensing clement;

a first output terminal connected to the signal processing circuit for outputting a processed signal of the signal processing circuit;

a branch circuit connected to the signal processing circuit for amplifying the processed signal;

a second output terminal connected to the branch circuit for outputting an amplified signal of the branch circuit;

an input terminal for receiving a self-diagnosis instruction signal from an external side;

a control circuit connected to the input terminal for controlling the single sensing element and the signal processing circuit to perform a self-diagnosis operation in response to the self-diagnosis instruction signal; and an internal clock generator for supplying internal clocks for timing operations of the control circuit, wherein all the single sensing element, the signal processing circuit, the first output terminal, the branch circuit, the second output terminal, the input terminal, the control circuit and the internal clock generator are integrated in a single circuit piece.

10. The sensor according to claim 9, wherein the branch circuit amplifies the processed signal in an inverted characteristic relative to the processed signal produced output from the first output terminal.

11. A method of diagnosing a capacitive physical quantity sensor comprising:

inputting a preparation signal into an input terminal of the capacitive physical quantity sensor for a first predetermined time;

determining whether an output terminal of the capacitive physical quantity sensor has output a first output signal for the first predetermined time or not in response to the preparation signal;

instructing a self-diagnosis by inputting art instruction signal into the input terminal for a second predetermined time; if the output terminal is determined to have output the first output signal for the first predetermined time; and diagnosing the capacitive physical quantity sensor to be normal, if the output terminal outputs a second output signal for the Second predetermined time, wherein the output terminal is a first output terminal, and the capacitive physical quantity sensor includes a second output terminal the capacitive physical quantity sensor has a first sensitivity and a second sensitivity for a single direction.

the first output terminal outputs a signal of the first sensitivity, the method includes amplifying the signal of the first sensitivity to produce a signal of a second sensitivity;

the second output terminal outputs the signal of the second sensitivity, and the diagnosing is performed based on a time, for which the signal of the second sensitivity continues.

12. The method according to claim 11, wherein: the first predetermined time is in a range between 0.1-0.5 msec.

* * * * *